(12) United States Patent
Cheng

(10) Patent No.: US 7,604,306 B1
(45) Date of Patent: Oct. 20, 2009

(54) RETICLE BOX TRANSPORT CART

(75) Inventor: Lin Cheng, Hsinchu (TW)

(73) Assignee: Taiwan Semiconductor Manufacturing Company, Hain-Chu (TW)

( * ) Notice: Subject to any disclaimer, the term of this patent is extended or adjusted under 35 U.S.C. 154(b) by 1032 days.

(21) Appl. No.: 09/934,549

(22) Filed: Aug. 23, 2001

(51) Int. Cl.
*A47B 46/00* (2006.01)

(52) U.S. Cl. .................. 312/249.8; 312/351

(58) Field of Classification Search .............. 312/249.8, 312/249.1, 209, 304, 351, 223.1, 244, 309; 414/935, 939, 940; 180/89.12, 89.13
See application file for complete search history.

(56) References Cited

U.S. PATENT DOCUMENTS

| | | | | |
|---|---|---|---|---|
| 1,247,827 A | * | 11/1917 | Hansen ........................ | 16/44 |
| 2,172,973 A | * | 9/1939 | Hays et al. .................... | 280/43 |
| 2,905,519 A | * | 9/1959 | O'Neil ........................ | 312/209 |
| 3,584,927 A | * | 6/1971 | Ott et al. ..................... | 312/209 |
| 4,019,793 A | * | 4/1977 | Gerding ...................... | 312/209 |
| 4,038,717 A | * | 8/1977 | Greathouse ............. | 280/79.11 |
| 4,083,575 A | * | 4/1978 | Smith et al. .................. | 280/43 |
| 4,293,075 A | * | 10/1981 | Veralrud ..................... | 312/350 |
| 4,346,498 A | * | 8/1982 | Welsch et al. .................. | 16/44 |
| 4,515,235 A | * | 5/1985 | Yamamoto et al. ............. | 16/44 |
| 4,682,927 A | * | 7/1987 | Southworth et al. ......... | 414/217 |
| 4,750,579 A | * | 6/1988 | Jarl et al. ................. | 180/24.02 |
| 4,822,116 A | * | 4/1989 | Relyea et al. ............... | 312/209 |
| 4,981,222 A | | 1/1991 | Lee | |
| 4,999,671 A | * | 3/1991 | Iizuka ........................ | 355/97 |
| 5,282,678 A | * | 2/1994 | Teufel et al. ............. | 312/249.8 |
| 5,320,225 A | | 6/1994 | Kirkpatrick | |
| 5,390,785 A | | 2/1995 | Garric et al. | |
| 5,423,651 A | * | 6/1995 | Dinverno .................. | 312/249.8 |
| 5,590,735 A | * | 1/1997 | Cartier .......................... | 16/44 |
| 5,749,589 A | * | 5/1998 | Hopkins et al. .......... | 280/79.11 |
| 5,782,356 A | | 7/1998 | Hugg | |
| 5,787,057 A | * | 7/1998 | Fan ......................... | 369/30.31 |
| 5,873,585 A | * | 2/1999 | Engelking ................ | 280/47.35 |
| 6,029,764 A | * | 2/2000 | Schubert .................. | 180/89.13 |
| 6,033,175 A | * | 3/2000 | Pflueger et al. ............. | 414/401 |
| 6,073,066 A | * | 6/2000 | Takahashi ................ | 180/89.12 |
| 6,196,001 B1 | | 3/2001 | Tannous et al. | |
| 6,247,769 B1 | * | 6/2001 | Spitzer et al. ............. | 312/249.8 |
| 6,305,500 B1 | * | 10/2001 | McCrandall et al. ........ | 187/267 |
| 6,421,113 B1 | * | 7/2002 | Armentrout .................. | 414/935 |
| 6,454,512 B1 | | 9/2002 | Weiss ......................... | 414/663 |
| 6,473,935 B1 | * | 11/2002 | Cherukuri ..................... | 16/44 |
| 6,524,057 B1 | * | 2/2003 | Park ......................... | 312/319.5 |

FOREIGN PATENT DOCUMENTS

| | | | | |
|---|---|---|---|---|
| DE | 3816803 | * | 11/1989 | ................. 312/209 |
| DE | 3917874 | * | 7/1990 | ................. 312/209 |
| DE | 4330434 | * | 3/1994 | ............... 312/249.8 |
| JP | 03095004 | * | 4/1991 | ............... 312/249.8 |
| JP | 03248443 | * | 11/1991 | ................. 414/940 |

\* cited by examiner

*Primary Examiner*—Hanh V Tran

(57) ABSTRACT

A new transportation cart is provided that separates each reticle box or container from other reticle boxes contained in the cart. The transportation cart provides additional shock absorption, thus eliminating effects of vibration of the reticles, the transportation cart is equipped with ESD protection and provides improved security to the transported reticles.

6 Claims, 2 Drawing Sheets

RETICLE BOX TRANSPORT CART

BACKGROUND OF THE INVENTION (1) Field of the Invention

The invention relates to the fabrication of integrated circuit devices, and more particularly, to a method and apparatus for the transportation of reticle boxes.

(2) Description of the Prior Art

In the creation of semiconductor devices, many interacting technical disciplines are required in order to produce semiconductor devices at a cost competitive price. While many of the disciplines address technologies that are exclusively associated with the creation of semiconductor devices, additional disciplines are required that act in support of semiconductor manufacturing facilities. While these additional disciplines may on the surface appear of a less deep-going technical nature, these disciplines are nevertheless fundamental to the successful operation of a semiconductor foundry.

One of the aspects of creating semiconductor devices is the making available of tool components and sub-components to the various processing stations and processing steps. It is well known in the art that photolithographic exposure of semiconductor surfaces is fundamentally important in the creation of semiconductor devices. One of the key components that is used during photolithographic exposures is the reticle, which contains the image of a pattern that must be exposed on an underlying surface. This reticle is detachable from the main tool in which the reticle is used, for instant a step-and-repeat exposure tool. The reason for this capability of being detached from the main tool is that the reticle must be readily interchangeable and must be available for other processing stations. This leads to the requirement that, once the reticle has been detached from a processing tool, this reticle must be safely and efficiently transported to the location where the reticle is required or to a storage location. In view of the expense incurred in creating the reticle, it is clear that this transportation must not cause any damage to the reticle while the reticle must during transportation be protected from outside influences to the maximum extent possible. Typically the reticle will be placed in a reticle container, which secures the reticle and which further protects the reticle. One additional step of protection is required where multiple reticles must be simultaneously transported, each reticle having being inserted into a reticle container. This transportation of multiple reticles is typically performed using a cart, commonly referred to as a reticle transportation cart. The common requirements that such a reticle transportation cart must meet are the following:

1. no static electricity must be generated during the process of transporting the reticles that are contained in the reticle containers (or boxes). This implies that the reticle containers cannot make physical contact with each other since such a contact would most likely result in a rubbing, frictional motion between the reticle containers, which is prone to create static electricity in the reticle containers that are in contact with each other.
2. the reticles must not be subjected to undue vibration, since vibration may result in damage to the reticle or to the images that are created on the surface of the reticle
3. the reticle cart must have Electro Static Discharge (ESD) protection to assure that no ESD will accumulate on the chart, which would further expose the reticle boxes and therefore the reticles to ESD
4. the reticle cart must provide adequate protection to the reticle boxes and by implication to the reticles U.S. Pat. No. 5,782,356 (Hugg) shows a container for transporting reticles.

U.S. Pat. No. 5,390,785 (Garric et al.) shows another container for transporting reticles.

U.S. Pat. No. 5,320,225 (Kirkpatrick), U.S. Pat. No. 4,981,222 (Lee) and U.S. Pat. No. 6,196,001 (Tannous et al.) show related semiconductor part vessels and containers.

SUMMARY OF THE INVENTION

A principle objective of the invention is to provide a method and apparatus for the save and efficient transportation of semiconductor production tools or sub-tools, most notably reticles that are used during semiconductor processing.

Another objective of the invention is to provide a method and apparatus of transportation of semiconductor production tools or sub-tools whereby no static electricity accumulates during the transportation process.

Yet another objective of the invention is to provide a method and apparatus of transportation of semiconductor production tools or sub-tools whereby the semiconductor production tools or sub-tools are not subjected to excessive vibration during the transportation process.

A still further objective of the invention is to provide a method and apparatus of transportation of semiconductor production tools or sub-tools that provide adequate protection to the production tools or sub-tools against Electro Static Discharge during the transportation process.

A still further objective of the invention is to provide a method and apparatus of transportation of semiconductor production tools or sub-tools that provides adequate security to the production tools or sub-tools during the transportation process.

In accordance with the objectives of the invention a new transportation cart is provided that separates each reticle box or container from other reticle boxes contained in the cart. The transportation cart provides additional shock absorption, thus eliminating effects of vibration of the reticles, the transportation cart is equipped with ESD protection and provides improved security to the transported reticles.

DESCRIPTION OF THE PREFERRED EMBODIMENTS

The essential design features of the reticle cart of the invention are summarized first, as follows, see FIG. 1:

10, the three dimensional view of the reticle cart of the invention

Figure 1:
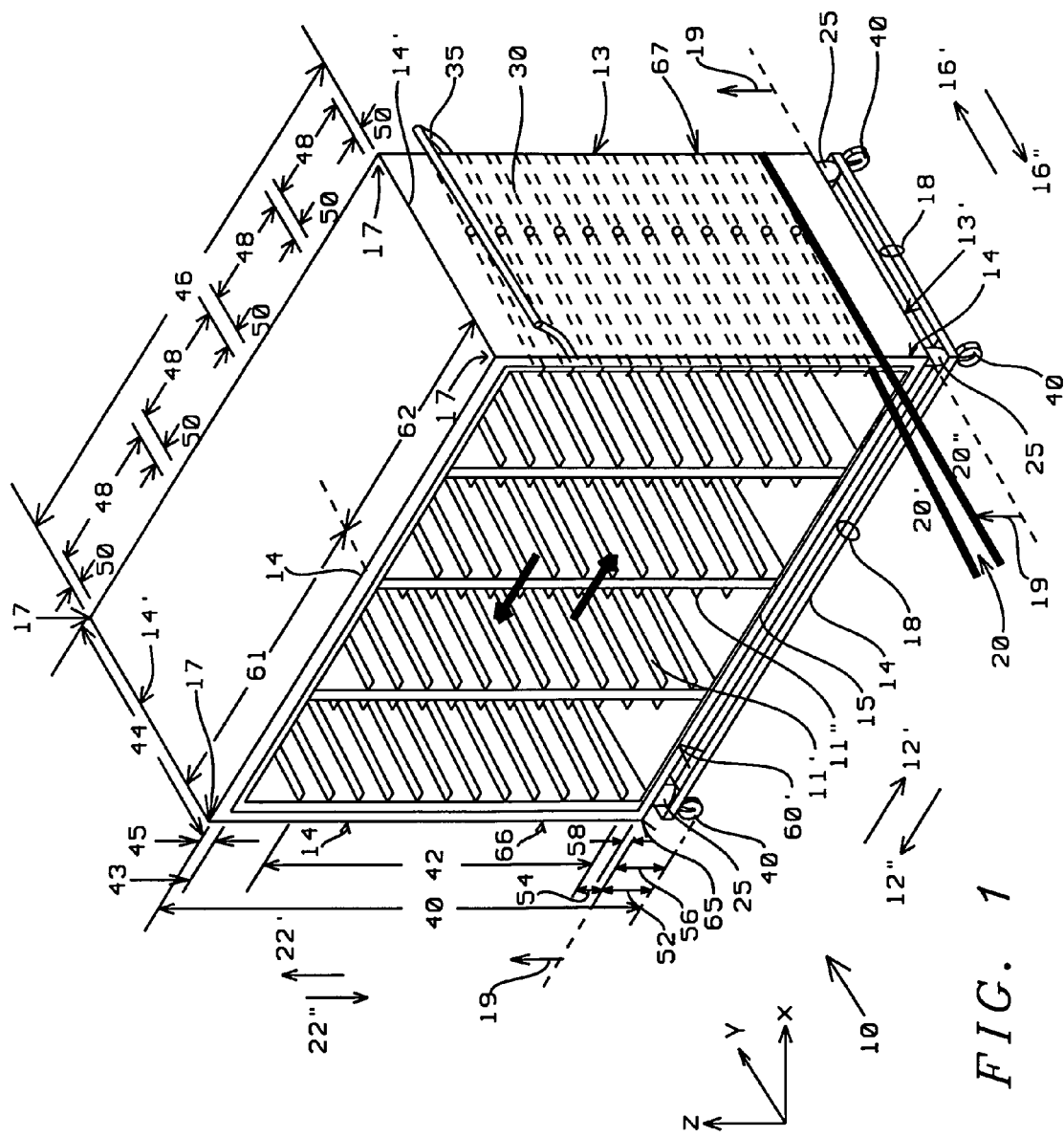
FIG. 1 shows a three dimensional view of the reticle cart of the invention.
Figure 2:
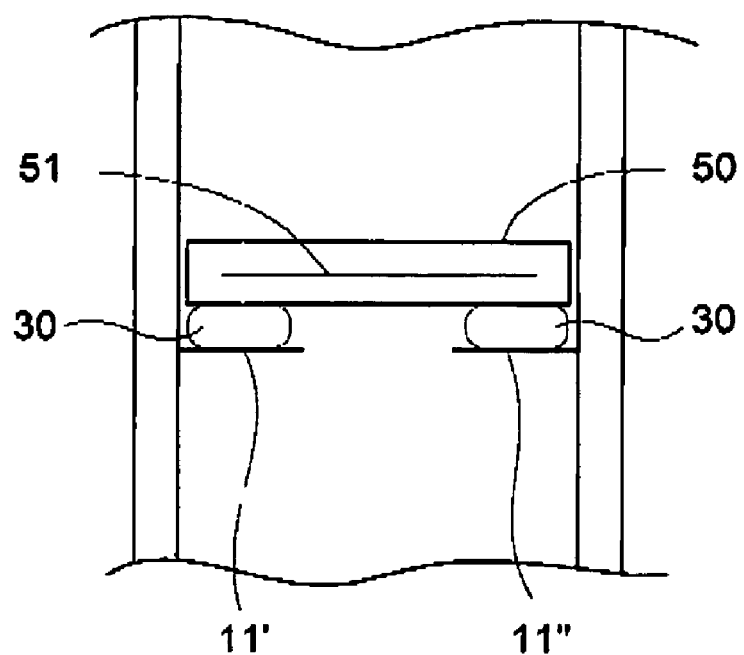
FIG. 2 is a cut-away front view showing the support cushions of the reticle cart of the invention.

60' and 60", two anti-ESD sliding doors of the reticle cart of the invention; it must be noted in the three dimensional view that is shown in FIG. 1 that doors 60' and 60", since these doors are transparent, as not readily visible; to overcome this difficulty the location and operation of doors 60' and 60" is now described in detail; the doors 60' and 60" are positioned above a sliding rail 15 in a plane of the front surface 14 of the reticle cart 10; doors 60' and 60" slide in directions 12' and 12" along the rail 15 in the plane of the front surface 14 of the reticle cart 10; each of these two units 60' and 60" covers essentially half of the front surface 14; starting from the position where unit 60' is located in an extreme 12" direction and unit 60" is located in an extreme 12' direction, the movement of unit 60' in the direction 12' opens the left most section of the reticle cart 10, the sliding unit 60' will slide behind the stationary unit 60", opening the front surface 14 of the reticle cart 10 over distance 61; starting from the position where unit 60' is located in an extreme 12" direction and unit 60" is located in an extreme 12' direction, the movement of unit 60" in the direction 12" opens the right most section of the reticle cart 10, the sliding unit 60" will slide in front of the stationary unit 60', opening the front surface 14 of the reticle cart 10 over distance 62;

20, an inclination of 8 degrees with the horizontal plane that is provided for the support of the reticles that are transported in the reticle cart of the invention 25, shock absorbers that are provided for each of the four corners 17 of the reticle cart of the invention 30, support cushions that are provided for the support of the reticle boxes that are transported in the reticle cart of the invention (also shown more clearly in FIG. 2)

35, a handle that is provided to the reticle cart of the invention to facilitate movement of the reticle cart of the invention 40, anti-ESD wheels, one wheel affixed to each of the four corners 17 of the reticle box of the invention.

Above have been listed the main sub-components of the reticle cart 10 of the invention, further highlighted in the three dimensional view of FIG. 1 are the following elements:

it is of value to state that the reticle cart 10 of the invention has three dimensions; these dimensions can typically be referred to as Cartesian X, Y and Z dimensions that have all the properties of conventional Cartesian X, Y and Z coordinates such as intersecting under an angle of 90 degrees; these Cartesian coordinates have been highlighted with directions 12' and 12" (for an X-direction), 16' and 16" (for an Y-direction) and 22' and 22" (for an X-direction); the Cartesian coordinates of the reticle cart of the invention can be defined as intersecting at point 65, placing the upper portion 19 of the reticle cart 10 of the invention above the X-Y plane in a Z-direction while placing supporting platform 18 of the reticle cart of the invention, shock absorbers 25 and anti-ESD wheels 40 below the X-Y plane in a Z-direction. Remains to be defined which X, Y and Z directions are considered as positive directions, these positive directions are the direction 12' (for the X-axis), 16' (for the Y-axis) and 22' (for the Z-axis). Directions that are opposite to the defined positive directions and that originate at the point of intersection 65 of the Cartesian coordinate axis are, by implication, defined as negative directions along this coordinate axis 14, the front surface of the reticle cart 10 of the invention, located in the X-Z plane of the reticle cart 10 of the invention and comprising point 65

13, the back surface of the reticle cart 10 of the invention, being parallel to the front surface 14 of the reticle cart 10 of the invention, having an intersect with the positive Y-axis 13', the bottom surface of the reticle cart 10 of the invention, located in the X-Y plane of the reticle cart 10 of the invention and comprising point 65

14', the top surface of the reticle cart of the invention, being parallel to the bottom surface 13' of the reticle cart 10 of the invention, having an intersect with the positive Z-axis 66, the left surface of the reticle cart of the invention, located in the Y-Z plane of the reticle cart 10 of the invention and comprising point 65

67, the right surface of the reticle cart of the invention, being parallel to the left surface 66 of the reticle cart 10 of the invention, having an intersect with the positive X-axis 74, dividers of the upper portion of the transportation cart.

All other elements that have been highlighted in the three dimensional view of FIG. 1 are parameters of dimension and will be detailed at a later time. For purposes of illustration and clarification, an example of a reticle box 70 has been highlighted in FIG. 1, a reticle 72 has been by way of example inserted into the reticle box 70.

FIG. 2 illustrates supports cushions 30 on support units 11' and 11" and supporting reticle box 50 including reticle 51 thereon.

1. Reticles are, prior to the loading of the reticle into the reticle cart of the invention, loaded into a reticle container or reticle box. This reticle box is not further discussed as part of the invention. It is assumed that the dimensions of the reticle box are such that a reticle can securely be positioned inside the reticle box and that further the reticle box can be securely positioned in the reticle cart of the invention.

2. The individual who is loading the reticle box into the reticle cart of the invention takes a position in front of the reticle cart, facing the front side 14 of the reticle cart. It must thereby by realized that the side of the reticle cart that is opposite the front side 14 of the reticle cart, that is the back side 13, is completely closed and is therefore not available for access to or entry into the reticle cart. The reticle box is positioned into the reticle cart of the invention in a horizontal position. This can be made clear by arbitrarily selecting two reticle support units 11' and 11" and following the method in which the reticle box is entered into the reticle cart: the anti-ESD door 60' is moved such that support units 11' and 11" are exposed, in the case of this example the door 60' is moved in a direction 12'. The reticle box is initially placed such that the reticle box is essentially in a horizontal position and such that the reticle box is aligned with support units 11' and 11", the reticle box makes initial contact with the forward extremities of supports 11' and 11". The forward extremities of support units 11' and 11" are the extremities of support units 11' and 11" that face or are closest to the front surface 14 of the reticle cart 10 of the invention. After this initial alignment of the reticle box, the reticle box is further entered into cart 10 by sliding the reticle box further along the support units 11' and 11" and into the cart, that is sliding the reticle box along support units 11' and 11" in a direction 16' (from the front side 14 of the reticle cart 10 to the back side 13 of the reticle cart). After this and other reticle boxes have been positioned in the reticle cart and at the time that the reticle cart has to be moved, the anti-ESD sliding doors 60' and 60" are closed, that is positioned such that the entire surface of the front side 14 of the reticle cart is covered by the anti-ESD sliding doors 60' and 60". It must further be emphasized that the surface of support units, such as support units 11' and 11", has been provided with support cushions 30 to further reduce the impact of vibration on the reticle boxes that are placed on the support units. This method of entering and subsequently transporting the reticle box(es) using the reticle cart 10 provides the following advantages:

(i) by positioning the reticle boxes into the reticle cart such that adjacent reticle boxes are not in physical contact with each other, ESD cannot take place from reticle box to reticle box (ii) by transporting the reticles using the method of loading of the reticle boxes that has been highlighted above (at the end of which loading procedure the anti-ESD sliding doors 60' and 60" are closed) the reticle boxes are firmly secured on the support units (support units 11' and 11" have been used in the example highlighted above), making it impossible for the reticle boxes to leave the position on top of the support units onto which the reticle boxes have been placed: the anti-ESD sliding doors 60' and 60" prevent forward movement, the enclosure of the back side 13 prevents backward motion, the support units (as for instance support units 11' and 11") prevent downward motion of the reticle box while finally gravity exerted on the reticle box will prevent upward motion of the reticle box, and (iii) the support cushions 30 that have been placed over the support units, such as support units 11' and 11", significantly reduce the impact of vibrations on the reticle boxes that have been placed inside the reticle cart of the invention.

3. The reticle cart of the invention is constructed with an emphasis on providing the maximum amount of electromagnetic shielding. This is accomplished by using metal for the majority of the components that are part of the reticle cart of the invention resulting in about 83% of the exposed surface of the reticle cart of the invention being metal (iron). The remaining 17% of the exposed surface of the reticle cart of the invention is made up of the anti-ESD sliding doors 60' and 60", which have been created using high-conductivity material. In addition, the reticle box support unit, such as units 11' and 11", are created using metal, preventing the build-up of any static charge on these support units.

4. It must be noted that the support units, onto which the reticle box is positioned, such as support units 11' and 11", are attached to the reticle cart under an angle of about 8 degrees. This is further highlighted using support units 20, that is individual support units 20' and 20". From the three-dimensional view that is shown in FIG. 1, it is apparent that these (and other) support units, when proceeding in a direction 16' along the support units, slope down from a horizontal plane. The result of this downward sloping of the support units 20' and 20" (and the other support units) is that the reticle box, once the reticle box has been positioned into the reticle cart 10 of the invention, is (by gravity) urged toward the back side 13 of the reticle cart, further assuring that the reticle box will not accidentally fall from the reticle cart of the invention even before the anti-ESD sliding doors 60' and 60" are closed.

5. Anti-ESD wheels 40 are made of high-conductivity material, providing a low resistivity conductive path to ground and thus preventing the build-up of electromagnetic charges, eliminating a potential source of ESD. An ohmic resistance of 16,000 ohm has been measured between the top of the shock absorbers 25 and ground.

6. Shock absorbers 25 provide an interface between the supporting platform 18 of the reticle cart of the invention and the upper portion 19 of the reticle cart 10 of the invention. Any motion of vibration and the like that is created by the motion of the anti-ESD wheels 40 along the surface over which the reticle cart 10 of the invention is transported will be absorbed by the shock absorbers 25 and will therefore not be transmitted to the upper portion 19 of the reticle cart 10 or to the therein contained reticle. The shock absorbers have been created such that an ohmic resistance of 4 Gega ohm has been measured between the upper portion 19 of the reticle cart of the invention and ground 7. The surface of support units, such as units 11'/11" and units 20'/20", have been provided with a soft or cushioning support such that the reticle boxes rest on this cushioned support and not on a metal surface. The cushion can be made of anti-ESD material that provides a cushioning (and simultaneously insulating) effect such as a sponge like substance, a plastic of low density, and the like).

Examples are given below of typical dimension that can be used for the creation of the reticle cart of the invention. It stands to reason that these dimensions do not limit the invention in any way. Referring to the three-dimensional view that is shown in FIG. 1, the following dimensions, all expressed in millimeter, can be used:

40: 1070 mm

42: a total of 11 support rails are shown in a vertical direction 19, the distance between adjacent support rails is 60 mm, therefore distance 42 equals 11×60=660 mm

43: 40 mm

44: 400 mm

45: 25 mm

46: 980 mm

48: 210 mm

50: 25 mm

51: 40 mm

52: 160 mm

54: 40 mm

56: 120 mm

58: 25 mm.

To summarize the reticle cart of the invention and the features that are provided by the implied method of transporting reticles:

high emphasis has been placed on eliminating ESD by using metals for the construction of the reticle cart and by using high-resistivity sliding doors in the reticle cart of the invention high emphasis has been placed on securing the reticle boxes inside the reticle cart of the invention prior to transportation of the reticle cart of the invention high emphasis has been placed on suppressing impact of vibrations on the reticles that are being transported.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A component transport cart, comprising:
(a) a lower portion, said lower portion comprising:
(i) wheels providing capabilities of motion to said transport cart;
(ii) a platform being substantially planar and having a bottom surface and a top surface opposite said bottom surface, said wheels being directly attached to and disposed underneath said first bottom surface of said platform;
(iii) shock absorbers, being mounted over and directly joined to said top surface of said platform and having vertically oriented axes;
(b) an upper portion disposed over said shock absorbers, said shock absorbers forming an interface between said platform and said upper portion, said upper portion comprising:
(i) a front surface being located in a plane;
(ii) a back surface being parallel with said front surface;

(iii) a planar bottom surface being orthogonal to said front and back surfaces and directly joined to said shock absorbers;
(iv) a top surface being parallel with said bottom surface;
(v) a left surface being located in a plane orthogonal to said planar bottom surface:
(vi) a right surface being parallel with said left surface;
(vii) upper portion dividers provided in a plane parallel with said left and right surfaces;
(viii) component box support units being mounted in a box support plane and capable of supporting a component box, adjacent rows of component box support units being separated by a distance, said component box support units:
(1) extending from said front surface of said component cart to said back surface of said component cart:
(2) being arranged along said upper portion dividers and said left and right surfaces;
(3) including cushioning units arranged over a surface of said component box support units;
(4) including said box support plane angled with respect to said planar bottom surface;
(ix) a set of two sliding doors mounted in a plane of said front surface of said component cart; and
(x) a handle attached to said upper portion, enabling motion of said component cart wherein said platform has a height substantially less than a height of said upper portion.

2. The component cart of claim 1, further comprising a component box which comprises a reticle box with a reticle disposed inside said reticle box.

3. The component cart of claim 1, said component cart formed of anti-Electro Static Discharge materials.

4. The component cart of claim 1, wherein said sliding doors are formed of anti-Electro Static Discharge materials.

5. The component cart of claim 1, wherein said box support plane is orthogonal with respect to said left and right surfaces and angled downwardly from said front surface.

6. The component cart of claim 1, further comprising a plurality of reticle boxes, each with a reticle therein, said reticle boxes laterally disposed and each supported by a corresponding component box support unit.

* * * * *